United States Patent
Farquhar et al.

(10) Patent No.: US 8,102,119 B2
(45) Date of Patent: Jan. 24, 2012

(54) ENCAPSULATED OPTOELECTRONIC DEVICE AND METHOD FOR MAKING THE SAME

(75) Inventors: Donald Seton Farquhar, Niskayuna, NY (US); Michael Scott Herzog, Voorheesville, NY (US); Christian Maria Anton Heller, Albany, NY (US)

(73) Assignee: General Electric Comapny, Niskayuna, NY (US)

( * ) Notice: Subject to any disclaimer, the term of this patent is extended or adjusted under 35 U.S.C. 154(b) by 120 days.

(21) Appl. No.: 12/510,463

(22) Filed: Jul. 28, 2009

(65) Prior Publication Data
US 2010/0148665 A1    Jun. 17, 2010

Related U.S. Application Data

(63) Continuation-in-part of application No. 12/336,683, filed on Dec. 17, 2008.

(51) Int. Cl.
  *H01L 51/50*   (2006.01)
(52) U.S. Cl. ...................................................... 313/512
(58) Field of Classification Search .................... 445/24; 313/504, 512
  See application file for complete search history.

(56) References Cited

U.S. PATENT DOCUMENTS

| | | | |
|---|---|---|---|
| 5,693,956 A | 12/1997 | Shi et al. | |
| 5,757,127 A * | 5/1998 | Inoguchi et al. | 313/507 |
| 5,882,761 A | 3/1999 | Kawami et al. | |
| 6,268,695 B1 | 7/2001 | Affinito | |
| 6,465,953 B1 | 10/2002 | Duggal | |
| 6,692,610 B2 | 2/2004 | Low et al. | |
| 6,724,143 B2 | 4/2004 | Chen et al. | |
| 6,835,950 B2 | 12/2004 | Brown et al. | |
| 6,872,114 B2 | 3/2005 | Chung et al. | |
| 6,949,389 B2 | 9/2005 | Pichler et al. | |
| 7,015,640 B2 | 3/2006 | Schaepkens et al. | |
| 7,033,850 B2 | 4/2006 | Tyan et al. | |
| 7,034,470 B2 | 4/2006 | Cok et al. | |
| 7,049,757 B2 | 5/2006 | Foust et al. | |

(Continued)

FOREIGN PATENT DOCUMENTS

GB   2416621 A1   1/2006

(Continued)

OTHER PUBLICATIONS

PCT International Search Report dated Oct. 28, 2010.

(Continued)

*Primary Examiner* — Toan Ton
*Assistant Examiner* — Hana Featherly
(74) *Attorney, Agent, or Firm* — Mary Louise Gioeni

(57) ABSTRACT

An encapsulated optoelectronic device includes: a first barrier layer; an electroluminescence device coupled to the first barrier layer, and comprising a substrate and an electroluminescence element both defining a lateral side, and the electroluminescence element comprising a first electrode disposed on the substrate, a second electrode, and an optoelectronically active layer between the first and second electrodes; a second barrier layer coupled to the electroluminescence device; and an adhesive located between and connecting the first and second barrier layers, and at least coupled to the lateral side of the electroluminescence device to seal the electroluminescence device; a first conductive area electrically coupled to the first electrode and electrically insulated from the second electrode and a second conductive area; the second conductive area electrically coupled to the second electrode and electrically insulated from the first electrode and the first conductive area. A method for making the encapsulated optoelectronic device is presented.

12 Claims, 5 Drawing Sheets

U.S. PATENT DOCUMENTS

| | | |
|---|---|---|
| 7,205,718 B2 | 4/2007 | Cok |
| 7,255,823 B1 | 8/2007 | Guenther et al. |
| 7,256,543 B2 | 8/2007 | Su et al. |
| 7,541,671 B2 | 6/2009 | Foust et al. |
| 2005/0212419 A1 | 9/2005 | Vazan et al. |
| 2006/0003474 A1 | 1/2006 | Tyan et al. |
| 2006/0093795 A1 | 5/2006 | Wang et al. |
| 2007/0172971 A1 | 7/2007 | Boroson |
| 2007/0281089 A1 | 12/2007 | Heller et al. |
| 2008/0048556 A1 | 2/2008 | Logunov et al. |
| 2008/0185701 A1 | 8/2008 | Foust et al. |
| 2008/0231180 A1 | 9/2008 | Waffenschmidt et al. |
| 2008/0241471 A1 | 10/2008 | Itai |
| 2008/0265754 A1 | 10/2008 | Young et al. |

FOREIGN PATENT DOCUMENTS

| | | |
|---|---|---|
| GB | 2416621 A | 2/2006 |
| WO | WO2006071329 A1 | 7/2006 |
| WO | WO2006107379 A1 | 10/2006 |
| WO | WO2008012460 A2 | 1/2008 |

OTHER PUBLICATIONS

PCT International Search Report dated Nov. 20, 2010 and Written Opinion.

\* cited by examiner

ENCAPSULATED OPTOELECTRONIC DEVICE AND METHOD FOR MAKING THE SAME

CROSS REFERENCE TO RELATED APPLICATION

This application is a continuation-in-part of U.S. patent application Ser. No. 12/336,683 filed on Dec. 17, 2008 and titled as ENCAPSULATION STRUCTURE AND METHOD OF ORGANIC ELECTROLUMINESCENCE DEVICE.

BACKGROUND

This invention relates generally to encapsulated structures and methods for making the encapsulated structures. More particularly, this invention relates to the encapsulated optoelectronic devices and methods for making the encapsulated optoelectronic devices.

Optoelectronic devices, e.g., organic light emitting devices (OLEDs) generally comprise multiple thin film layers formed on a substrate such as glass or silicon. A light-emitting layer of a luminescent organic solid, as well as optional adjacent semiconductor layers, is sandwiched between a cathode and an anode. The semiconductor layers may be hole-injecting or electron-injecting layers. The light-emitting layer may be selected from any of a multitude of fluorescent or phosphorescent organic solids and may comprise multiple sublayers or a single blended layer.

When a potential difference is applied across the anode and cathode, electrons move from the cathode to the optional electron-injecting layer and finally into the layer(s) of organic material. At the same time, holes move from the anode to the optional hole-injecting layer and finally into the same organic light-emitting layer(s). When the holes and electrons meet in the layer(s) of organic material, they combine and produce photons. The wavelength of the photons depends on the material properties of the organic material in which the photons are generated, and the color of light emitted from the OLED can be controlled by the selection of the organic material, or by the selection of dopants, or by other techniques known in the art.

In a typical OLED, either the anode or the cathode is transparent in order to allow the emitted light to pass through. If it is desirable to allow light to be emitted from both sides of the OLED, both the anode and cathode can be transparent.

The OLEDs have a number of beneficial characteristics, such as a low activation voltage, quick response, high brightness, high visibility, and uncomplicated process of fabrication. Thus, the OLEDs represent a promising technology for display applications and for general illumination.

However, although substantial progresses have been made in the development of the OLEDs to date, additional challenges still remain. For example, the OLEDs continue to face challenges associated with their long-term stability. One of the challenges limiting the widespread use of the OLEDs has been the fact that the organic polymers or small molecule materials making up the device as well as, in some cases, the electrodes, are environmentally sensitive. In particular, it is well known that device performance degrades in the presence of moisture and/or oxygen.

In addition, it may be desired to provide electrical connection between encapsulated optoelectronic devices, e.g., OLEDs. Therefore, there is a need for a new and improved encapsulation structure and method of the optoelectronic devices.

BRIEF DESCRIPTION

In one aspect, the present invention relates to an encapsulated optoelectronic device comprising: a first barrier layer; an electroluminescence device configured to be coupled to the first barrier layer, and comprising a substrate and an electroluminescence element both defining a lateral side, and the electroluminescence element comprising a first electrode disposed on the substrate, a second electrode, and an optoelectronically active layer disposed between the first and the second electrodes; a second barrier layer configured to be coupled to the electroluminescence device; and an adhesive configured to be located between the first and second barrier layers, and at least to be coupled to the lateral side of the electroluminescence device to seal the electroluminescence device between the first and the second barrier layers; a first conductive area disposed on the first barrier layer, located between the first and second barrier layers, and configured to be electrically coupled to the first electrode and electrically insulated from the second electrode and a second conductive area; the second conductive area disposed on the first barrier layer, located between the first and second barrier layers, and configured to be electrically coupled to the second electrode and electrically insulated from the first electrode and the first conductive area.

In another aspect, the present invention relates to a method of making an encapsulated optoelectronic device, comprising: providing a first barrier layer; providing an electroluminescence device configured to be coupled to the first barrier layer, the electroluminescence device comprising a substrate and an electroluminescence element both defining a lateral side, and the electroluminescence element comprising a first electrode disposed on the substrate, a second electrode, and an optoelectronically active layer disposed between the first and the second electrodes; providing a second barrier layer configured to be coupled to the electroluminescence device; and providing an adhesive configured to be located between the first and the second barrier layers, and at least to be coupled to the lateral side of the electroluminescence device to seal the electroluminescence device between the first and the second barrier layers; and providing a first conductive area disposed on the first barrier layer, located between the first and the second barrier layers, and configured to be electrically coupled to the first electrode and electrically insulated from the second electrode and a second conductive area; the second conductive area disposed on the first barrier layer, located between the first and the second barrier layers, and configured to be electrically coupled to the second electrode and electrically insulated from the first electrode and the first conductive area.

In another aspect, the present invention relates to an encapsulated optoelectronic device comprising: a first barrier layer; an electroluminescence device configured to be coupled to the first barrier layer, and comprising a substrate and an electroluminescence element both defining a lateral side, the electroluminescence element comprising a first electrode disposed on the substrate, a second electrode, and an optoelectronically active layer disposed between the first and the second electrodes; a second barrier layer configured to be coupled to the electroluminescence device; and an adhesive configured to be located between the first and the second barrier layers, and at least to be coupled to the lateral side to seal the electroluminescence device between the first and the second barrier layers; a conductive area disposed on the first barrier layer, located between the first and the second barrier layers, and configured to be electrically coupled to at least one of the first and the second electrodes of the electroluminescence device and electrically insulated from another of the first and the second electrodes of the electroluminescence device.

BRIEF DESCRIPTION OF THE DRAWINGS

The above and other aspects, features, and advantages of the present disclosure will become more apparent in light of the following detailed description when taken in conjunction with the accompanying drawings in which like characters represent like parts throughout the drawings, wherein.

DETAILED DESCRIPTION OF THE DISCLOSURE

Embodiments of the present disclosure will be described herein with reference to the accompanying drawings, throughout which same characters represent same parts. In the following description, well-known functions or constructions are not described in detail to avoid obscuring the disclosure in unnecessary detail. The singular forms "a", "an" and "the" include plural referents unless the context clearly dictates otherwise.

Figure 1:
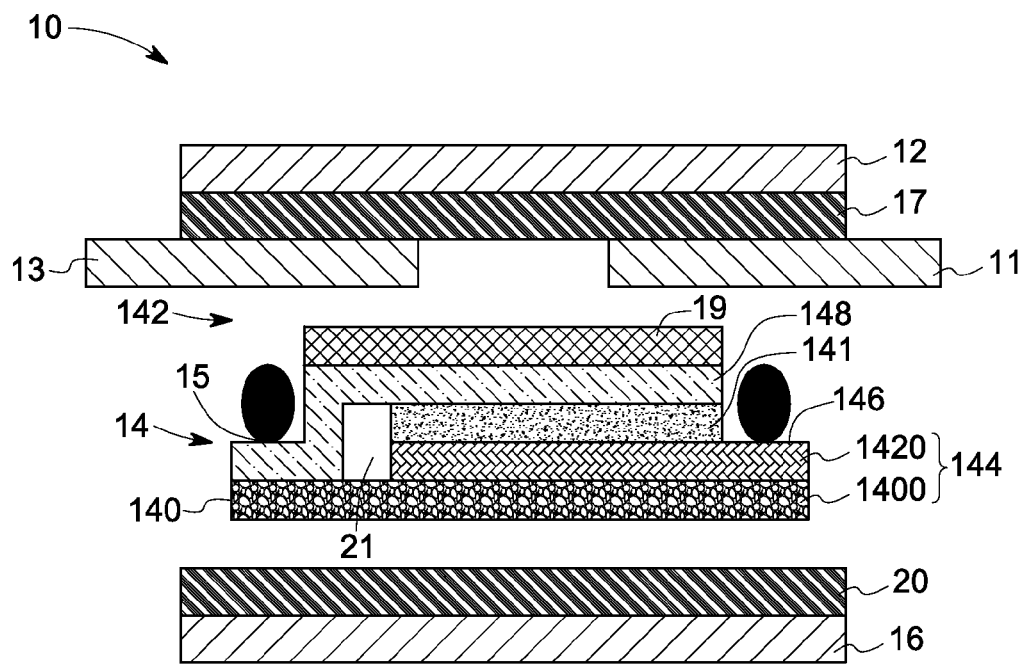
FIG. 1 is a schematic exploded diagram of an encapsulated optoelectronic device in accordance with a first embodiment of the invention.
Figure 2:
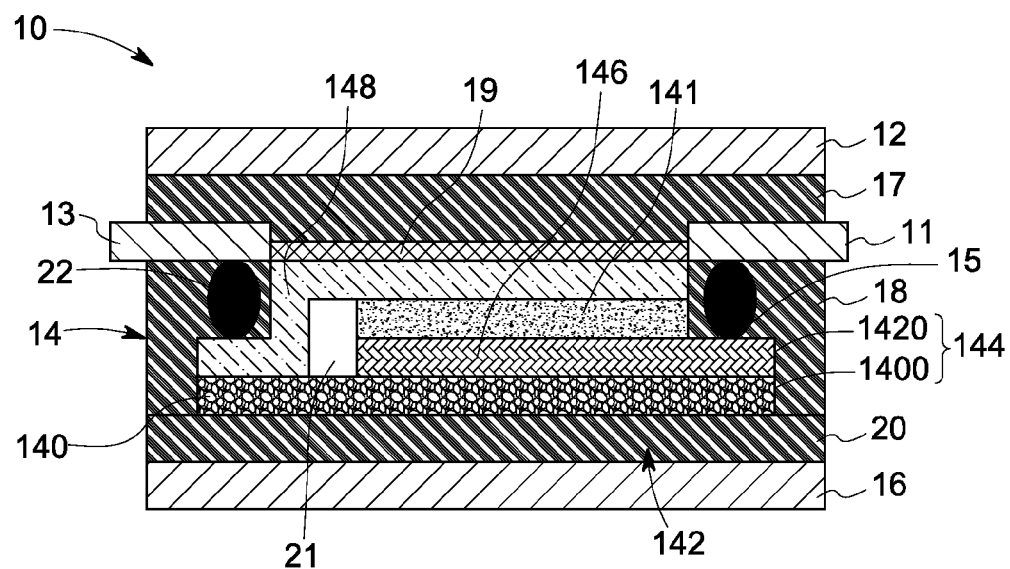
FIG. 2 is a schematic assembled diagram of the encapsulated optoelectronic device of FIG. 1.
Figure 3:
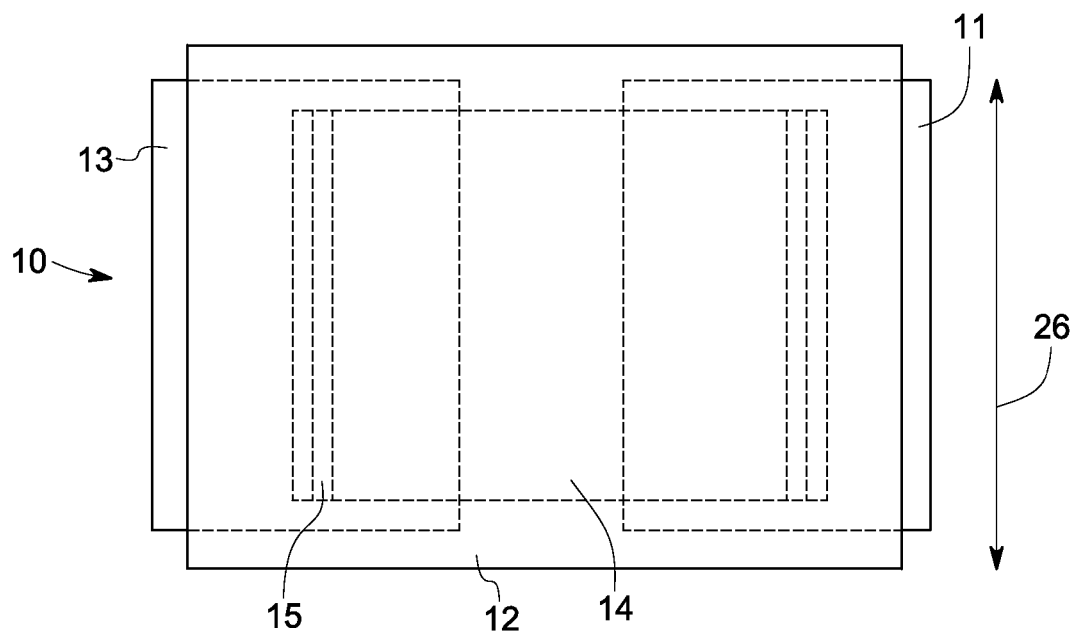
FIG. 3 is a schematic top planar diagram of the encapsulated optoelectronic device of FIG. 2.

FIGS. 1-3 respectively illustrate schematic exploded, assembled and top planar diagrams of an encapsulated optoelectronic device 10 in accordance with a first embodiment of the invention. As illustrated in FIGS. 1 to 3, the optoelectronic device 10 comprises a first barrier layer 12; an electroluminescence device 14 configured to be coupled to the first barrier layer 12, and comprising a substrate 140 and an electroluminescence element 142 both defining a lateral side 144. The electroluminescence element 142 comprises a first electrode 146 disposed on the substrate 140, a second electrode 148, and an optoelectronically active layer 141 disposed between the first and second electrodes 146, 148. A second barrier layer 16 is configured to be coupled to the electroluminescence device 14. An adhesive 18 is configured to be located between the first and second barrier layers 12, 16, and at least to be coupled to the lateral side 144 of the electroluminescence device 14 to seal the electroluminescence device 14 between the first and second barrier layers 12, 16. A first conductive area 11 is disposed on the first barrier layer 12, located between the first and second barrier layers 12, 16, and configured to be electrically coupled to the first electrode 146 and electrically insulated from the second electrode 148 and a second conductive area 13. The second conductive area 13 is disposed on the first barrier layer 12, located between the first and second barrier layers 12, 16, and configured to be electrically coupled to the second electrode 148 and electrically insulated from the first electrode 146 and the first conductive area 11.

In the illustrated embodiment, two conductive elements 15 are located on the first and the second electrodes 146, 148 and conductive materials 22 are disposed on the conductive elements 15 to electrically connect the first and the second electrodes 146, 148 with the corresponding first and the second conductive areas 11, 13 respectively, in a face to face manner. A scribe line 21 electrically insulates the first and the second electrodes 146, 148. The scribe line 21 is not electrically conductive and is a void scribed using a laser or mechanically or by chemical etching, or alternately the scribe line 21 may be replaced with an insulator. In other embodiments, the boundaries of the layers are positioned so that there is no electrical short between the first and the second electrodes 146, 148, and no void or insulator is required, e.g., the optoelectronically active layer 141 could fill the void. In the illustrated embodiment, a second adhesive layer 17 is directly disposed on the first barrier layer 12 and the first and second conductive areas 11, 13 are directly disposed on the second adhesive layer 17. The second adhesive layer 17 electrically insulates the first and the second conductive areas 11, 13 from the first barrier layer 12. A first protection layer 19 is disposed on the second electrode 148 to electrically insulate the second electrode 148 from the first and the second conductive areas 11, 13. A third adhesive layer 20 is disposed between the substrate 140 and the second barrier layer 16.

As illustrated in FIGS. 1 to 3, in one non-limiting example, the first barrier layer 12 and the second barrier layer 16 may be disposed parallel to each other. The adhesive 18 may be located between and connect the first barrier layer 12 and the second barrier layer 16 to seal the electroluminescence device 14. In the illustrated embodiment, the lateral side 144 comprises a first lateral side 1420 of the electroluminescence element 142 and a second lateral side 1400 of the substrate 140. In non-limiting examples, the adhesive 18 may be at least coupled to one or more of the first and second lateral sides 1400 and 1420 with desired width(s) to seal the lateral side 1400 and/or the lateral side 1420. In one example, the adhesive 18 may be disposed on both the first and second lateral sides 1400 and 1420 to cooperate with the third adhesive layer 20 and the first and the second conductive areas 11, 13 to seal the electroluminescence device 14 from environmental hazards, such as oxygen and moisture.

In another aspect, a method of making an encapsulated optoelectronic device 10, comprises: providing a first barrier layer 12; providing an electroluminescence device 14 configured to be coupled to the first barrier layer 12, the electroluminescence device 14 comprising a substrate 140 and an electroluminescence element 142 both defining a lateral side 144, and the electroluminescence element 142 comprising a first electrode 146 disposed on the substrate 140, a second electrode 148, and an optoelectronically active layer 141 disposed between the first and second electrodes 146, 148; providing a second barrier layer 16 configured to be coupled to the electroluminescence device 14; and providing an adhesive 18 located between the first and second barrier layers, and at least to be coupled to the lateral side 144 of the electroluminescence device 14 to seal the electroluminescence device 144 between the first and second barrier layers; and providing a first conductive area 11 disposed on the first barrier layer 12, located between the first and second barrier layers 12, 16, and configured to be electrically coupled to the first electrode 146 and electrically insulated from the second electrode 148 and a second conductive area 13; the second conductive area 13 disposed on the first barrier layer 12, located between the first and second barrier layers 12, 16, and configured to be electrically coupled to the second electrode 148 and electrically insulated from the first electrode 146 and the first conductive area 11.

The fabrication or assembly may be accomplished in a lamination process. The conductive areas 11, 13 are deposited on the first barrier layer 12. The sealing adhesive 20 is deposited on the second barrier layer 16. The first barrier layer, the OLED device and the second barrier are all positioned in relative alignment. Lamination is performed by providing suitable heat, pressure and time under vacuum or in a controlled atmosphere. The process may be in batch configuration or in a continuous roll to roll process. The arrow 26 in FIG. 3 indicates the direction of the web movement in the roll to roll continuous processing.

Figure 4:
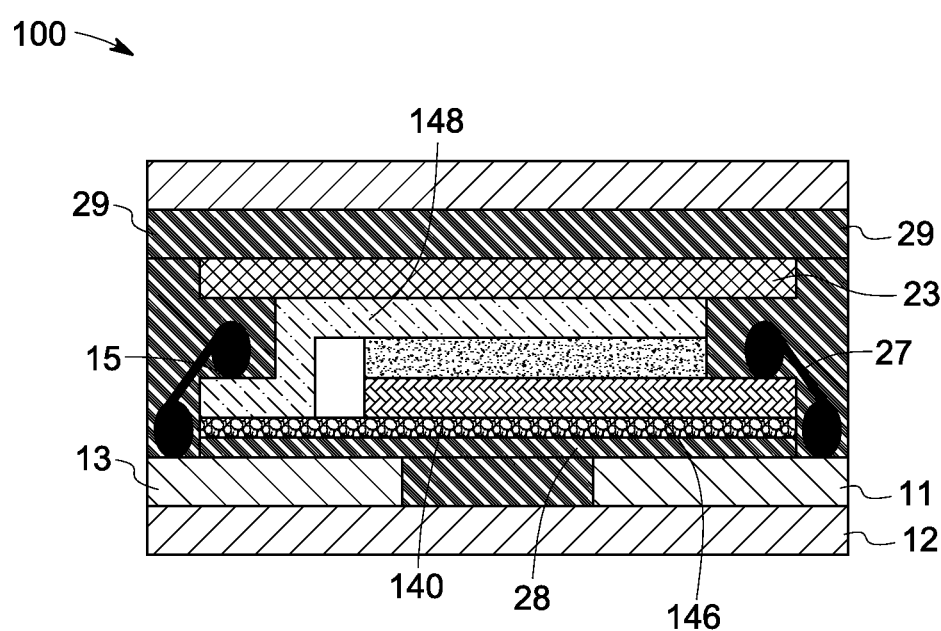
FIG. 4 is a schematic assembled diagram of an encapsulated optoelectronic device in accordance with a second embodiment of the invention.

FIG. 4 is a schematic assembled diagram of an encapsulated optoelectronic device 100 in accordance with a second embodiment of the invention. Same numerals in FIGS. 1-4 may indicate similar elements. The encapsulated optoelectronic device 100 is similar with the encapsulated optoelectronic device 10 except that the first barrier layer 12 is disposed on the substrate 140 and the conductive elements 15 of the first and the second electrodes 146, 148 electrically connect with the first and the second conductive areas 11, 13 via wires 27, instead of in the face to face manner. The first barrier layer 12 is transparent. A fourth adhesive layer 28 is disposed between the substrate 140 and the first and the second conductive areas 11, 13. A third protection layer 23 is disposed on the second electrode 148. A fifth adhesive layer 29 is disposed on the third protection layer 23.

Figure 5:
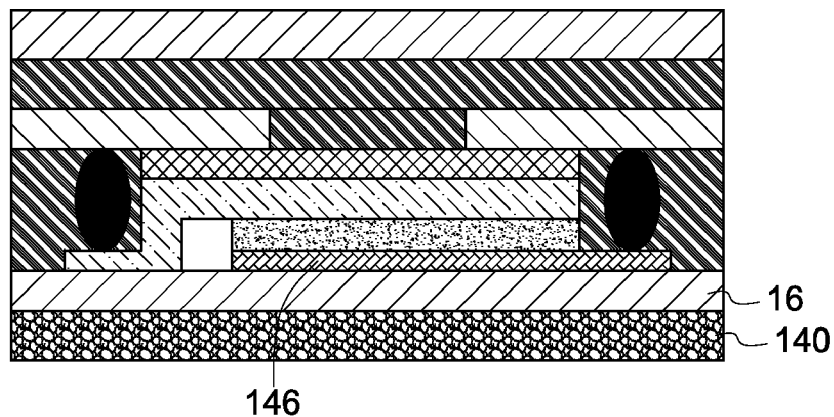
FIG. 5 is a schematic assembled diagram of an encapsulated optoelectronic device in accordance with a third embodiment of the invention.

FIG. 5 is a schematic assembled diagram of an encapsulated optoelectronic device 200 in accordance with a third embodiment of the invention. The encapsulated optoelectronic device 200 is similar with the encapsulated optoelectronic device 10 except that the second barrier layer 16 is disposed between the substrate 140 and the first electrode 146. In such way, the second barrier layer 16 is integral with the substrate 140 and a total thickness of the optoelectronic device 200 may be reduced to suit some applications where low thickness encapsulated optoelectronic device is desired.

Figure 6:
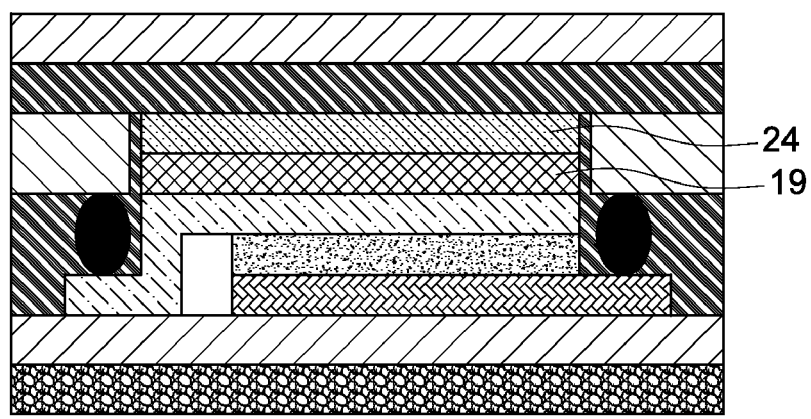
FIG. 6 is a schematic assembled diagram of an optoelectronic device in accordance with a fourth embodiment of the invention.

FIG. 6 is a schematic assembled diagram of an encapsulated optoelectronic device 300 in accordance with a fourth embodiment of the invention. The encapsulated optoelectronic device 300 is similar with the encapsulated optoelectronic device 200 except that a second protection layer 24 is disposed on the first protection layer 19. The second protection layer 24 may be aluminum foil that is bonded to the first protection layer 19 with a suitable adhesive (not shown).

Figure 7:
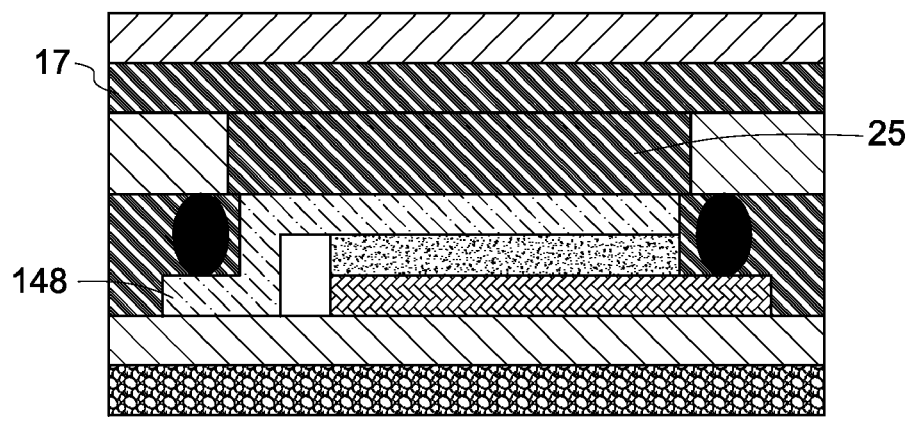
FIG. 7 is a schematic assembled view of an optoelectronic device in accordance with a fifth embodiment of the invention.

FIG. 7 is a schematic assembled diagram of an encapsulated optoelectronic device 400 in accordance with a fifth embodiment of the invention. The encapsulated optoelectronic device 400 is similar with the encapsulated optoelectronic device 300 except that a sixth adhesive layer 25 is located between the second electrode 148 and the second adhesive layer 17. The sixth adhesive layer 25 may be directly disposed between the second electrode 148 and the second adhesive layer 17 or, in some embodiments, directly disposed between the second electrode 148 and any of the first and the second protection layers 19, 24 (not shown).

Figure 8:
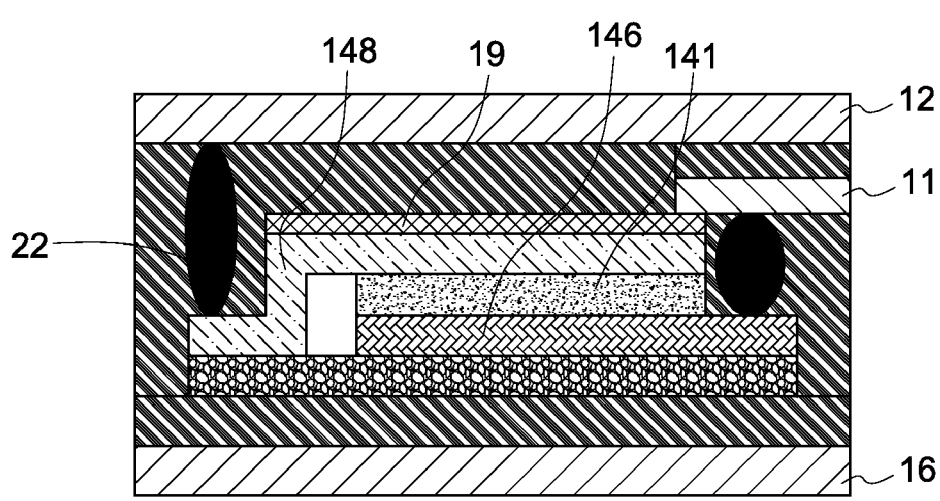
FIG. 8 is a schematic assembled view of an optoelectronic device in accordance with a sixth embodiment of the invention.

FIG. 8 shows a sixth embodiment of the invention in which the first barrier layer 12 of an encapsulated optoelectronic device 500 is an opaque metal film and directly electrically connects with the second electrode 148 via the conductive material 22. In this embodiment, there is only one conductive area 11 electrically connecting with the first electrode 146 via the conductive material 22. The second barrier layer 16 is transparent. The encapsulated optoelectronic device 500 may be modified without departing in any way from the spirit of the present disclosure, e.g., the first electrode 146 instead of the second electrode 148 directly electrically connects with the first barrier layer 12 while the second electrode 148 instead of the first electrode 146 electrically connects with the conductive area 13 (not shown in FIG. 8).

Although there shows only one electroluminescence device 14 between the first and the second barrier layers 12, 16 in FIGS. 1-7, there may be multiple electroluminescence devices 14 and corresponding structures (e.g., first and conductive areas 11, 13) between the first and the second barrier layers 12, 16. For example, multiple electroluminescence devices 14 may be arranged in such a way that adjacent electroluminescence devices share one or both of the first and the second conductive areas 11, 13 and some of the first and the second conductive areas 11, 13 are externally accessible.

Figure 9:
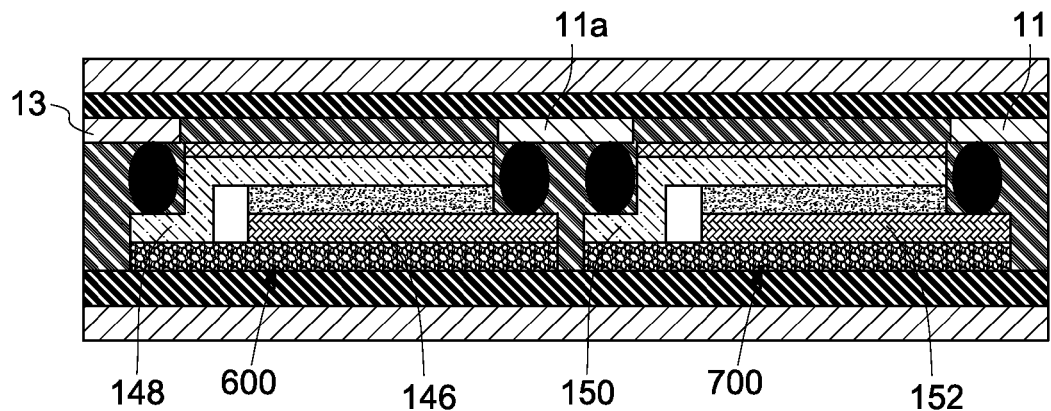
FIG. 9 is a schematic assembled view of two optoelectronic devices in accordance with a seventh embodiment of the invention.

FIG. 9 shows a schematic assembled view of two optoelectronic devices 600, 700 electrically connected in series in accordance with a seventh embodiment of the invention. The first electrode 146 of the optoelectronic device 600 and a third electrode 150 of adjacent optoelectronic device 700 electrically connect with a common internal conductive area 11a between the optoelectronic devices 600, 700. Conductive areas 11, 13 in outer sides of the optoelectronic devices 600, 700 are externally accessible or in other embodiments, electrically connect with other optoelectronic devices (not shown) in similar ways as the internal conductive area 11a connects the optoelectronic devices 600, 700. In some embodiments, the first electrode 146 of the device 600 and a fourth electrode 152 of the device 700 may have the same polarity, e.g., both being anodes. The second electrode 148 of the device 600 and the third electrode 150 of the device 700 may have the same polarity, e.g., both being cathodes.

Figure 10:
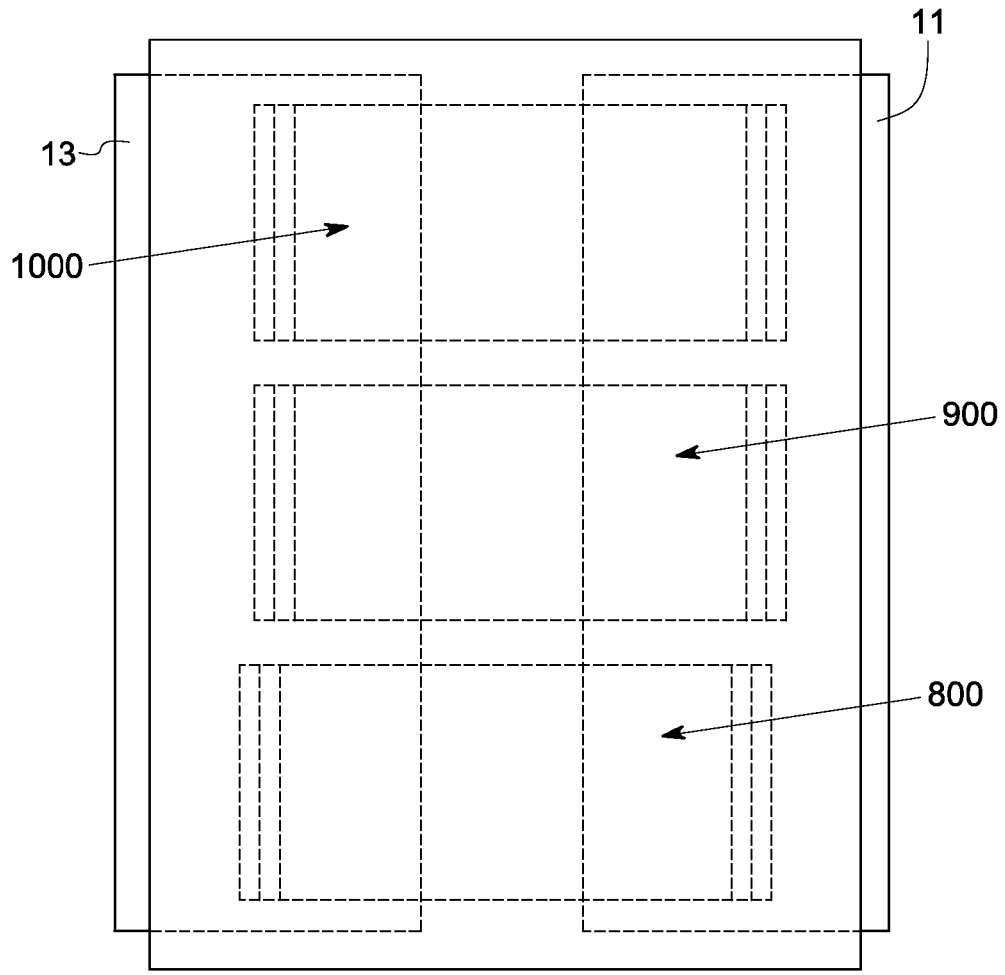
FIG. 10 is a schematic top planar view of three optoelectronic devices in accordance with an eighth embodiment of the invention.

FIG. 10 shows a schematic top planar view of three optoelectronic devices 800, 900, 1000 electrically connected in parallel in accordance with an eighth embodiment of the invention. The first electrodes (not labeled) of the devices 800, 900, 1000 are connected to a common conductive area 11 and the second electrodes (not labeled) of the devices 800, 900, 1000 are connected to a common conductive area 13. In other embodiments, there may be two or more than three optoelectronic devices connected in parallel.

In embodiments of the invention, the electroluminescence device 14 may be an "OLED" (organic light emitting diode) or a "PLED" (polymer light emitting diode). As known in the art, the optoelectronically active layer 141 may comprise a single layer or two or more sublayers to cooperate with anodes and cathodes to emit light. The anodes and cathodes inject charge carriers, i.e., holes and electrons, into the optoelectronically active layer 141 where they recombine to form excited molecules or excitons, which emit light when the molecules or excitons decay. The color of light emitted by the molecules depends on the energy difference between the excited state and the ground state of the molecules or excitons. In non-limiting examples, the optoelectronically active layer may have a thickness of about 50-500 nanometers, and the electrodes each may have a thickness of about 100-1000 nanometers.

In non-limiting examples, the substrate 140 may comprise glass, metal foil, plastic or polymeric material. The plastic or polymeric materials may be useful for fabricating flexible devices. Such materials may comprise poly(ethylene terephthalate) (PET), poly(butylene terephthalate) (PBT), poly(enthylene naphthalate) (PEN), Polycarbonate (PC), polyimides (PI), polysulfones (PSO), poly(p-phenylene ether sulfone) (PES), polyethylene (PE), polypropylene (PP), poly(vinyl chloride) (PVC), polystyrene (PS) and poly(methyl methyleacrylate) (PMMA) etc. Additionally, other materials, which can serve as a substrate may also be employed.

In some embodiments, the first electrode 146 may serve as an anode, and the second electrode 148 may serve as a cathode. The anode comprises transparent indium tin oxide (ITO) coated on the transparent substrate 140, and the cathode comprises aluminum, which can be referred to as a bottom-emitting configuration. The second barrier layer 16 is transparent and the first barrier layer 12 may be transparent or opaque. In other embodiments, the electroluminescence device may be configured to a top-emitting configuration (not shown), which can be easily implemented by one skilled in the art, that is, the first electrode 146 may serve as a cathode, and the second electrode 148 may serve as an anode. Thus, depending on different applications, the substrate 140 and the first and second barrier layers 12, 16 may be opaque or transparent. In both top and bottom emitting configurations, conductive areas 11, 11a and 13 are configured in a way that does not block the light emission from the optoelectronically active layer.

In embodiments of the invention, the cathode generally may comprise a material having a low work function value such that a relatively small voltage causes emission of electrons from the cathode. In some embodiments, besides the aluminum, the cathode may comprise calcium or a metal such as silver, magnesium, or a magnesium/silver alloy. Alternatively, the cathode may be made of two layers to enhance electron injection. Non-limiting examples of the cathode may comprise a thin inner layer of either LiF or NaF followed by a thicker outer layer of aluminum or silver, or a thin inner layer of calcium followed by a thicker outer layer of aluminum or silver.

The anode generally may comprise a material having a high work function value. In some embodiments, the anode may be transparent so that light generated in the organic light-emitting layer can propagate out of the luminescence device 10. In non-limiting examples, besides the ITO, the anode may comprise tin oxide, nickel, or gold, and may be formed by conventional vapor deposition techniques, such as evaporation or sputtering.

The adhesives may be the same material. Various techniques, such as dispensing, screen-printing and contact printing, may be used to apply the adhesives. In embodiments of the invention, the adhesives may be thermoplastic or thermosetting, and may be thin, for example, about or less than 50 ums, about or less than 25 microns (um), or as thin as 12 microns (um) or even less. Thus, the geometry of the encapsulation structure may create a long lateral path for preventing moisture and/or oxygen. In one non-limiting example, assuming a thickness of the adhesive may be 50 um, and the seal width on the first or second lateral side may be 10 mm. As can be seen, the ratio of the width and the thickness is large so that the lateral path for moisture ingress may be difficult. Depending on different requirements, the dimensions of the encapsulation structure may be altered accordingly.

The adhesives, e.g., are electrically insulating and may be selected for low cost, easy processing in large areas as well as transparency, low moisture permeability, and good adhesion, and may have capacities to absorb moisture and/or oxygen to prevent moisture and/or oxygen from reaching the OLED device 14. In non-limiting examples, the adhesives may comprise a polymeric material, such as epoxy, acrylic urethane, silicone, rubber, vinyl, or polyolefin.

The protection layers may be electrically insulating coatings and may comprise organic or inorganic materials. Non-limiting examples of the protective material in the protection layers comprise organic including polymer adhesive layers comprising thermosets, such as epoxies or urethanes, and thermoplastics, such as olefins, amines, and acrylics. These materials can be applied by lamination or coating, and may be cured subsequently. In other examples, the material may include a second phase filler, either organic or inorganic such as silica.

In embodiments of the invention, the first and second barrier layers 12, 16 may be configured to prevent the diffusion of moisture and oxygen into the region of the electroluminescence element 142. In non-limiting examples, the first and second barrier layers 12, 16 are respectively continuous layers and may comprise material such as organic material, inorganic material, or metal foils. Organic material may comprise carbon, hydrogen, oxygen, sulfur, nitrogen, and/or silicon, etc. The inorganic material may comprise oxide, nitride, carbide, boride, oxynitride, oxycarbide, or combinations thereof. And the metal foils may comprise aluminum (Al), silver (Ag) or chromium (Cr), etc.

Alternatively, the first and the second barrier layers 12, 16 may comprise hybrid organic/inorganic material, etc. The organic materials may comprise acrylates, epoxies, epoxyamines, xylenes, siloxanes, silicones, etc. In one example, the second barrier layer 16 may comprise glass, plastic or polymeric material, similar to the material of the substrate 140, such as PET, PBT, PEN, PC, PI, PSO, PES, PE, PP, PVC, PS, and PMMA etc. The first barrier layer 12 may comprise the reflective material, such as Al, Ag or Cr etc. In other examples, the first barrier layer 12 may comprise a material having a coating of the reflective material, for example, a metal may be coated on glass, plastic or polymeric material. The first barrier layer 12 with the reflective coating may be implemented to reflect any radiation emitted away from the substantially transparent flexible substrate 140 and direct such radiation toward the flexible substrate 140 such that the total amount of radiation emitted in this direction is increased. In certain embodiments, the first barrier layer 12 may advantageously include a material to prevent diffusion of reactive environmental elements, such as oxygen and moisture, into the electroluminescence element 142. In the illustrated embodiment, the second barrier layer 16 is flexible and comprises PET, and the first barrier layer 12 comprises the reflective aluminum foil.

The first and the second conductive areas 11, 11a, 13 are parts of an electrical circuit printed on the first barrier layer 12 and in some embodiments, printed directly on the second adhesive layer 17. In some embodiments, the first barrier layer 12 in non-conductive, the conductive areas 11, 11a and 13 are printed directly on the first barrier layer 12, and the second adhesive layer 17 is omitted. The first and the second conductive areas 11, 11a, 13 are electrically insulated from each other and at least some of them are externally accessible to be electrically connectable externally, e.g., with another encapsulated optoelectronic device.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. An encapsulated optoelectronic device comprising:
a first barrier layer;
an electroluminescence device configured to be coupled to the first barrier layer, and comprising a substrate and an electroluminescence element both defining a lateral side, and the electroluminescence element comprising a first electrode disposed on the substrate, a second electrode, and an optoelectronically active layer disposed between the first and the second electrodes;
a second barrier layer configured to be coupled to the electroluminescence device; and
an adhesive configured to be located between the first and the second barrier layers, and at least to be coupled to the lateral side of the electroluminescence device to seal the electroluminescence device between the first and the second barrier layers;
a first conductive area disposed on the first barrier layer, located between the first and the second barrier layers, and configured to be electrically coupled to the first electrode and electrically insulated from the second electrode and a second conductive area;
the second conductive area disposed on the first barrier layer, located between the first and the second barrier layers, and configured to be electrically coupled to the second electrode and electrically insulated from the first electrode and the first conductive area;
a second adhesive layer directly disposed on the first barrier layer, wherein the first and second conductive areas are directly disposed on the second adhesive layer; and
two conductive elements located on the first and the second electrodes, wherein the first and the second electrodes electrically connect with the corresponding first and the second conductive areas, respectively, in a face to face manner.

2. The encapsulated optoelectronic device according to claim 1, additionally comprising a first protection layer disposed on the second electrode to electrically insulate the second electrode from the first and the second conductive areas.

3. The encapsulated optoelectronic device according to claim 2, further comprising a second protection layer disposed on the first protection layer.

4. The encapsulated optoelectronic device according to claim 1, wherein the second barrier layer is transparent.

5. The encapsulated optoelectronic device according to claim 1, comprising a third adhesive layer disposed between the substrate and the second barrier layer.

6. The encapsulated optoelectronic device according to claim 1, wherein the second barrier layer is disposed between the substrate and the first electrode.

7. An encapsulated optoelectronic device comprising:
a first barrier layer;
an electroluminescence device configured to be coupled to the first barrier layer, and comprising a substrate and an electroluminescence element both defining a lateral side, and the electroluminescence element comprising a first electrode disposed on the substrate, a second electrode, and an optoelectronically active layer disposed between the first and the second electrodes;
a second barrier layer configured to be coupled to the electroluminescence device; and
an adhesive configured to be located between the first and the second barrier layers, and at least to be coupled to the lateral side of the electroluminescence device to seal the electroluminescence device between the first and the second barrier layers;
a first conductive area disposed on the first barrier layer, located between the first and the second barrier layers, and configured to be electrically coupled to the first electrode and electrically insulated from the second electrode and a second conductive area;
the second conductive area disposed on the first barrier layer, located between the first and the second barrier layers, and configured to be electrically coupled to the second electrode and electrically insulated from the first electrode and the first conductive area;
wherein the first barrier layer is disposed on the substrate and the electroluminescence device comprises two conductive elements to electrically connect the first and the second conductive areas via wires.

8. The encapsulated optoelectronic device according to claim 7, wherein the first barrier layer is transparent.

9. The encapsulated optoelectronic device according to claim 7, further comprising a fourth adhesive layer directly disposed on the second barrier layer and a third protection layer disposed between the fourth adhesive layer and the second electrode.

10. An encapsulated optoelectronic device comprising:
a first barrier layer;
an electroluminescence device configured to be coupled to the first barrier layer, and comprising a substrate and an electroluminescence element both defining a lateral side, the electroluminescence element comprising a first electrode disposed on the substrate, a second electrode, and an optoelectronically active layer disposed between the first and the second electrodes;
a second barrier layer configured to be coupled to the electroluminescence device; and
an adhesive configured to be located between the first and the second barrier layers, and at least to be coupled to the lateral side to seal the electroluminescence device between the first and the second barrier layers;
a conductive area disposed on the first barrier layer, located between the first and the second barrier layers, and configured to be electrically coupled to one of the first and the second electrodes of the electroluminescence device and electrically insulated from another of the first and the second electrodes of the electroluminescence device; wherein there is a second electroluminescence device configured in an adjacent configuration with the electroluminescence device, and comprising a third electrode adjacent to the one of the first and the second electrodes, and wherein the third electrode and the one of the first and the second electrodes are electrically connected to the conductive area.

11. The encapsulated optoelectronic device of claim 10, wherein the third electrode is different from the one of the first and the second electrodes in polarity thereof.

12. The encapsulated optoelectronic device of claim 10, wherein the third electrode is same as the one of the first and the second electrodes in polarity thereof.

* * * * *